United States Patent
Akram et al.

(10) Patent No.: US 7,166,915 B2
(45) Date of Patent: Jan. 23, 2007

(54) MULTI-CHIP MODULE SYSTEM

(75) Inventors: Salman Akram, Boise, ID (US); David R. Hembree, Boise, ID (US); James M. Wark, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/032,734

(22) Filed: Dec. 28, 2001

(65) Prior Publication Data

US 2002/0053733 A1    May 9, 2002

Related U.S. Application Data

(60) Division of application No. 09/102,224, filed on Jun. 22, 1998, now Pat. No. 6,395,565, which is a continuation of application No. 08/614,301, filed on Mar. 12, 1996, now Pat. No. 5,807,762.

(51) Int. Cl.
*H01L 23/34* (2006.01)

(52) U.S. Cl. .............. 257/723; 257/724; 257/725; 257/726; 257/E21.526

(58) Field of Classification Search ........ 257/E21.526, 257/723–726; 438/15, 107, 108
See application file for complete search history.

(56) References Cited

U.S. PATENT DOCUMENTS

| | | |
|---|---|---|
| 4,899,107 A | 2/1990 | Corbett et al. |
| 4,992,849 A | 2/1991 | Corbett et al. |
| 4,992,850 A | 2/1991 | Corbett et al. |
| 5,107,328 A | 4/1992 | Kinsman |
| 5,137,836 A | 8/1992 | Lam |
| 5,138,434 A | 8/1992 | Wood et al. |
| 5,155,067 A | 10/1992 | Wood et al. |
| 5,239,747 A | 8/1993 | Ewers |
| 5,241,266 A | 8/1993 | Ahmad et al. |
| 5,266,912 A | 11/1993 | Kledzik |
| 5,279,029 A * | 1/1994 | Burns .......................... 264/102 |
| 5,367,253 A | 11/1994 | Wood et al. |
| 5,378,981 A | 1/1995 | Higgins, III |
| 5,424,652 A | 6/1995 | Hembree et al. |
| 5,448,165 A | 9/1995 | Hodge et al. |
| 5,461,544 A | 10/1995 | Ewers |
| 5,468,655 A | 11/1995 | Greer |
| 5,475,317 A | 12/1995 | Smith |
| 5,502,333 A * | 3/1996 | Bertin et al. ................. 257/685 |
| 5,517,515 A | 5/1996 | Spall et al. |
| 5,549,716 A | 8/1996 | Takahashi et al. |
| 5,581,510 A | 12/1996 | Furusho et al. |

(Continued)

FOREIGN PATENT DOCUMENTS

JP    01025264 A *    1/1989

(Continued)

*Primary Examiner*—David E. Graybill
(74) *Attorney, Agent, or Firm*—TraskBritt, PC

(57) ABSTRACT

Multi-chip module systems and method of fabrication thereof wherein the equivalent of a failed die of a multi-chip module (MCM) is added to the module in a vacancy position previously constructed with appropriate electrical connections. A variety of different dice may be attached to the same vacancy position of an MCM by means of adapters, wherein each adapter has the same footprint, but different adapters are capable of accommodating different numbers and types of dice.

28 Claims, 2 Drawing Sheets

U.S. PATENT DOCUMENTS

| | | |
|---|---|---|
| 5,610,081 A | 3/1997 | Ping et al. |
| 5,623,395 A * | 4/1997 | Derouiche et al. ....... 174/138 G |
| 5,634,267 A | 6/1997 | Farnworth et al. |
| 5,640,762 A | 6/1997 | Farnworth et al. |
| 5,661,330 A * | 8/1997 | Aimi et al. .................. 257/529 |
| 5,703,760 A | 12/1997 | Zhu |
| 5,712,768 A * | 1/1998 | Werther ...................... 361/767 |
| 5,719,440 A | 2/1998 | Moden |
| 5,723,907 A | 3/1998 | Akram |
| 5,726,492 A * | 3/1998 | Suzuki et al. ................ 257/685 |
| 5,754,410 A | 5/1998 | Bardsley et al. |
| 5,807,762 A | 9/1998 | Akram et al. |
| 5,836,071 A * | 11/1998 | Falcone et al. ................ 29/593 |
| 5,904,497 A * | 5/1999 | Akram ........................ 438/106 |
| 5,956,233 A | 9/1999 | Yew et al. |
| 5,959,310 A | 9/1999 | Akram et al. |
| RE36,325 E * | 10/1999 | Corbett et al. .............. 257/723 |
| 6,002,178 A * | 12/1999 | Lin .............................. 257/778 |
| 6,049,975 A * | 4/2000 | Clayton ........................ 29/832 |
| 6,127,253 A | 10/2000 | Roldan et al. |
| 6,153,926 A * | 11/2000 | Kawamoto ................... 257/676 |
| 6,201,304 B1 * | 3/2001 | Moden ........................ 257/774 |
| 6,249,052 B1 * | 6/2001 | Lin .............................. 257/737 |
| 6,395,565 B1 | 5/2002 | Akram et al. |

FOREIGN PATENT DOCUMENTS

JP     09191076 A  *  7/1997

* cited by examiner

MULTI-CHIP MODULE SYSTEM

CROSS-REFERENCE TO RELATED
APPLICATIONS

This application is a divisional of application Ser. No. 09/102,224, filed Jun. 22, 1998, now U.S. Pat. No. 6,395,565, issued May 28, 2002, which is a continuation of application Ser. No. 08/614,301, filed Mar. 12, 1996, now U.S. Pat. No. 5,807,762, issued Sep. 15, 1998.

BACKGROUND OF THE INVENTION

1. Field of the Invention

This invention relates generally to multi-chip module systems and their method of fabrication. More specifically, the present invention relates to multi-chip module systems and their method of fabrication using known-good-die (KGD) therein.

2. State of the Art

An integrated circuit (IC) typically includes a semiconductor die (die) electrically attached to a leadframe, which provides physical support for the die and is used to connect the die with external circuitry located on a substrate. In such an arrangement, the leadframe and die are typically connected by means of wires, such as gold, aluminum, etc., being encapsulated within a plastic package, although ceramic and metal packages may also be used depending on the operating environment and the packaging requirements of the die.

With ever increasing demands for miniaturization and higher operating speeds, multi-chip module systems (MCMs) are increasingly attractive in a variety of electronics. MCMs that contain more than one die can help minimize the system operational speed restrictions imposed by long printed circuit board connection traces by combining, for example, the processor, memory, and associated logic into a single package. In addition, MCMs offer packaging efficiency.

Generally, MCMs may be designed to include more than one type of die within a single package, or may include multiples of the same die, such as the single-in-line memory module (SIMM) or single-in-line package (SIP).

It is well known that semiconductor dies have an early failure rate, often referred to in reliability terms as infant mortality. As with all assemblies, this phenomenon is also present in MCMs. For example, an MCM composed of ten dice, each die having an individual reliability yield of 95%, would result in a first pass test yield of less than 60%, while an MCM composed of twenty dice, each die having an individual reliability yield of 95%, would produce a first pass test yield of less than 36%. The market's perception of this phenomenon affects the decision to use MCMs in various applications.

Previously, an unacceptable die in an MCM, which has been subjected to burn-in and testing, has required either the replacement of such a die or the discard of the MCM, both being time consuming and expensive. Additionally, since replacing an unacceptable die on an MCM poses risks to other MCM components during the replacement operation, it may be desirable to discard an MCM with such a die, rather than attempt to rework the MCM, particularly where the reliability of the replacement die is not known.

Depending on the extent of testing and/or burn-in procedures employed, a die may typically be classified into varying levels of reliability and quality. For example, a die may meet only minimal quality standards by undergoing standard probe testing or ground testing while still in wafer form, while an individual separated die may be subjected to tests at full-range temperatures with full burn-in being subsequently termed a known-good-die (KGD).

A cost-effective method for producing known reliable MCMs is desirable for industry acceptance and use of MCMs in various applications. In an attempt to provide known reliable MCMs complying with consumer requirements, it is desirable either to fabricate an MCM of KGD or to fabricate an MCM of probe tested dice and subsequently subject the MCM to burn-in and performance testing. However, using only KGD in an MCM may not be cost effective since each KGD has been subjected to performance and burn-in testing, which are costly. In contrast to the use of all KGD in an MCM, when using dice with well known production and reliability histories, particularly where the dice being used is known to have a low infant mortality rate, the use of such minimally tested dice to produce an MCM may be the most cost-effective alternative.

As previously stated, since typical testing and burn-in procedures are generally labor and time intensive, posing significant risks to the dice of an MCM, in an instance where an MCM is produced from minimally tested dice and in the event that the MCM contains an unacceptable die, replacement of unacceptable dice with a KGD is preferable in the rework of the MCM because rework with KGD should not require the MCM to be subjected to further burn-in, but rather only performance testing.

An example of a multi-chip module having a plurality of dynamic random access memory devices (DRAMs) used as memory in a computer is illustrated in U.S. Pat. No. 4,992,850, issued Feb. 12, 1991, to Corbett et al., assigned to the assignee of the present invention.

An example of a method and apparatus for the testing and burn-in of an individual die prior to packaging is illustrated in U.S. Pat. No. 5,424,652, issued Jun. 13, 1995, to Hembree et al., assigned to the assignee of the present invention. Such a method and apparatus provide a source of KGD to allow for the rework of an unacceptable die in an MCM with a KGD.

Other examples of a method for the testing and burn-in of an individual die prior to packaging are illustrated in U.S. Pat. Nos. 5,448,165 and 5,475,317.

In other instances, it is known to test a die in a package for functionality and replace any defective die. Such is illustrated in U.S. Pat. Nos. 5,137,836, 5,378,981, and 5,468,655.

In yet another instance, as illustrated in U.S. Pat. Nos. 5,239,747 and 5,461,544, it is known to test a multi-chip module (SIMM) to determine if any of the semiconductor devices mounted thereon are non-functional and, if so, replace the defective device with a device which has either been subjected to burn-in, or the entire multi-chip module can be subjected to another burn-in process after the replacement of the defective device. However, the defective devices are merely replaced by removing the defective device and replacing it with another, either a device subjected to burn-in or not. This process can be complicated, time consuming and costly, depending upon the type of device, the type of mounting of the device on the substrate, and the type of substrate used for mounting.

Therefore, a need exists for the cost-efficient fabrication of MCMs of known performance and reliability requirements.

BRIEF SUMMARY OF THE INVENTION

The present invention relates to known reliable multi-chip module systems and their method of fabrication. The present invention relates to multi-chip module systems and their method of fabrication using known-good-die (KGD) therein. In one embodiment of the present invention, a multi-chip module system is fabricated from probe tested dice, burned-in, and if a die requires replacement after burn-in of the multi-chip module system, a known-good-die is used for replacement of the failed die. In another embodiment of the present invention, the multi-chip module system and the method of fabrication thereof includes a module having the capacity to accommodate at least two semiconductor die, the module accommodating at least one more die than is desired to meet the module's intended function and performance parameters. Accordingly, the multi-chip module of the present invention includes at least one die and at least one vacant position capable of accommodating one or more additional die where an acceptable die may be located in the module if it is determined that an unacceptable die is present from the testing and/or burn-in of the multi-chip module system.

BRIEF DESCRIPTION OF THE SEVERAL VIEWS OF THE DRAWINGS

The features and advantages of the present invention can be more readily understood with reference to the following description and appended claims when taken in conjunction with the accompanying drawings wherein:

DETAILED DESCRIPTION OF THE INVENTION

Figure 1:
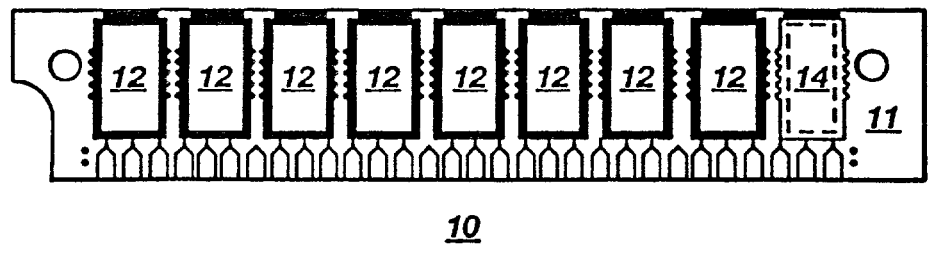
FIG. 1 is a top view of one embodiment of a SIMM type MCM in accordance with the present invention.

In accordance with the method of the present invention, a multi-chip module system (MCM) having at least one die attached thereto is subjected to burn-in procedures and performance testing to identify whether any die or die of the MCM is unacceptable, such procedures being well known in the art.

In the event that one or more dice is unacceptable, a known-good-die (KGD) compatible with the unacceptable die is added to the MCM by positioning the KGD into a vacant position on the MCM, which position is configured to accept such a die as the unacceptable die. Likewise, where an MCM contains more than one unacceptable die, an equal number of KGDs may be added into vacant positions on the MCM, which positions have been configured to accept such dice as the unacceptable dice. It is to be understood, however, that fewer KGDs may be added than there are unacceptable dice where the combined effect of the KGD added to the MCM produces the same desired result. For example, where a megabyte memory MCM having ten individual one megabyte dice is determined to have two unacceptable dice, a single two megabyte die may be added to the MCM for an equivalent overall result of ten megabytes of memory.

The method of the present invention is applicable to MCMs that contain only one type of die, as well as to MCMs that contain more than one type of die. In the situation where an MCM contains only one type of die (e.g., SIMM type or SIP type), one or more vacant positions are provided on the MCM to accommodate an additional die in the event the MCM fails to meet its predetermined performance characteristics. The vacant position or positions are constructed with the necessary connections and traces in the event a KGD is later added to the MCM.

In one embodiment, a SIMM having ten individual die, for example, would be constructed with eleven die positions, wherein the eleventh position would be left vacant. Although the eleventh position is initially left vacant, appropriate connections are provided in the SIMM in case a die is subsequently positioned in the vacant slot. In the event one die is found to be unacceptable, a KGD would be added to the eleventh position and, if possible, the unacceptable die and the associated circuitry on the SIMM disabled and left on the SIMM. Accordingly, the unacceptable die may not need to be removed and no further burn-in is required since the added die is a KGD, thereby saving considerable expense and time and avoiding damage or complications associated with any further burn-in of the SIMM after the replacement of the unacceptable die. The corrected SIMM, including both the unacceptable die and the added KGD, then only needs to be subjected to testing procedures to ensure proper functioning of the SIMM. However, such testing is inexpensive and not time consuming when compared to either burn-in procedures or burn-in and subsequent testing procedures. Alternatively, if the unacceptable die cannot be disabled and remain in the SIMM, the unacceptable die is removed from its location or merely disconnected while functionally leaving the die in its place and a KGD added in the vacant position in the SIMM as described hereinbefore.

Particularly in situations where an MCM contains more than one type of die, a variety of different vacant positions may be provided at appropriate positions on the MCM so as to maximize efficient use of space on the MCM. In addition, a variety of adapters may be used for attaching different types of die to an MCM. Different adapters, each being positionable within the same vacant slot of an MCM, are capable of supporting different types of die. In particular circumstances, more than one type of die may be supported by a single adapter. In one embodiment, the adapter may also serve as a testing substrate, thereby facilitating individual die burn-in, wherein the die is attached to the adapter prior to burn-in.

As will be seen from the description of the present invention described hereinbelow, the method of the present invention facilitates the fabrication of known reliability multi-chip modules (MCM) and reduces the time and costs associated with the fabrication thereof.

Referring to FIG. 1 of the drawings, a SIMM type MCM 10 or SIMM in accordance with the present invention is shown. The SIMM 10 has eight dice 12 of the same type mounted on a suitable substrate 11. Although the SIMM 10 requires eight die 12 to meet its design requirements, a ninth die position 14 is produced on substrate 11 of the SIMM 10 with suitable connections (not shown). The SIMM 10, having eight dice 12 and one vacant position 14, is subjected to suitable predetermined testing and burn-in procedures to ensure conformance with desired predetermined performance characteristics.

Figure 2:
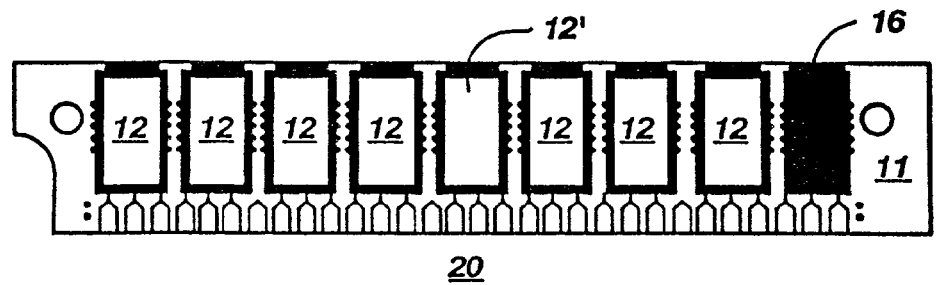
FIG. 2 is a top view of the corrected SIMM of FIG. 1, illustrating the addition of a KGD.

Referring to FIG. 2 of the drawings, in the event the SIMM 10 fails to meet its predetermined performance characteristics, if possible, the identified unacceptable die 12', determined through procedures well known in the art, is not reworked, but is instead left in its respective position on the SIMM 10 with the die and its associated circuitry on the SIMM being disabled. As shown, an individual KGD 16, determined through procedures well known in the art, is added to the substrate 11 of SIMM 10 in the vacant position 14. The resulting corrected SIMM 20, after being subject to appropriate testing to verify its performance characteristics, is then known to be a reliable MCM without requiring additional burn-in. Alternatively, if the unacceptable die 12' may not remain in the SIMM 10, it is removed and a KGD is added to the substrate 11 of the SIMM 10 in the vacant position 14 as described hereinbefore.

It is to be understood that in the event two dice of the SIMM have been found to be unacceptable, a single KGD 16, having twice the memory of each of the individual dice 12, may be installed in the vacant position 14. An MCM having more than two failed dice can likewise be corrected in the same manner. In alternative embodiments, particularly where size and space limitations are not critical, more than one vacant position 14 may be produced on the SIMM 10, whereby the number of unacceptable dice 12' may be replaced by an equivalent number of KGDs 16.

Figure 3:
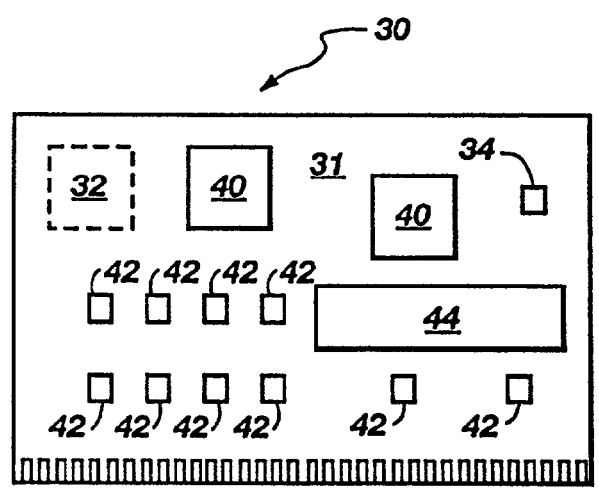
FIG. 3 is a top view of one embodiment of an MCM illustrating different types of die and two different vacant die positions.

Referring to FIG. 3, a first MCM 30 having more than one type of die is shown. In one embodiment, two different vacant positions 32 and 34 are produced on the substrate 31 of the first MCM 30, each capable of accommodating different types of dice. Suitable electrical connections are provided to the vacant positions 32 and 34 on the substrate 31 in the event a die is to be subsequently added to either of the vacant positions 32 or 34. The first MCM 30 of FIG. 3 is designed with three different types of die 40, 42, and 44. In the event that die 40 is unacceptable, an equivalent KGD (not shown) may be added to the vacant position 32. Likewise, in the event that die 42 is unacceptable, an equivalent KGD may be added to the vacant position 34. In this particular example, an equivalent of die 44, if determined to be unacceptable, is generally not possible due perhaps to the relatively large size of the die 44 and the fact that there is only one die 44 on the first MCM 30. However, under certain circumstances, the first MCM 30, having an unacceptable die 44, may be corrected by adding a combination of KGDs equivalent to dice 40 and 42 in vacant positions 32 and 34, respectively. An alternative vacant position (not shown) may be provided to accommodate a KGD equivalent of die 44. Additionally, the vacant positions 32 and 34 may be located on opposite sides of the substrate 31 of the MCM 30, if desired.

It is to be understood that any appropriate number of vacant positions 32 and 34 may be provided on the substrate 31 of the first MCM 30. In alternative embodiments, at least one vacant position is provided for each type of dice utilized on an MCM. In another embodiment of the invention, the vacant position 32 is positioned within the region defined by the larger vacant position 34. More than one such "double vacancy" position may be produced on a single MCM.

Figure 4:
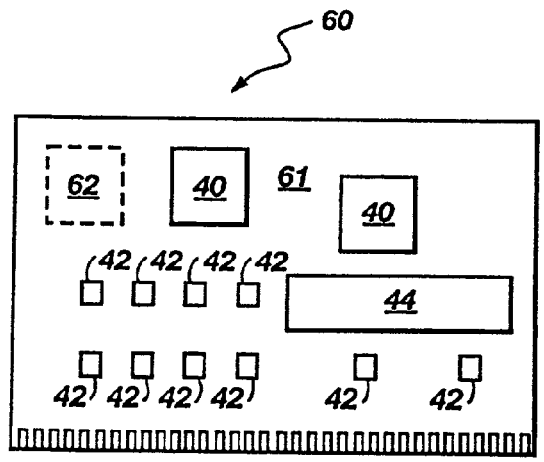
FIG. 4 is a top view of an alternative embodiment of the MCM of FIG. 3, having a single vacant die position for the accommodation of a die adapter.
Figure 5:
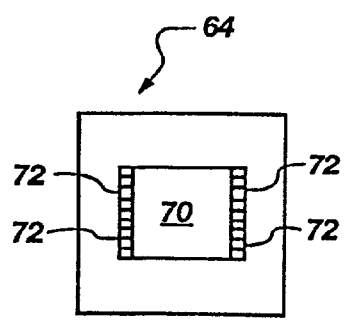
FIG. 5 is a top view of one embodiment of a semiconductor die adapter in accordance with the present invention.
Figure 6:
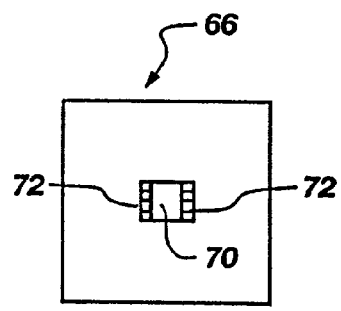
FIG. 6 is a top view of an alternative embodiment of a semiconductor die adapter.

Referring to FIG. 4, an alternative embodiment of the first MCM 30 is shown generally at 60. The second MCM 60 is designed to meet the same consumer operational and performance requirements as those of the first MCM 30 and contains the same number and types of die 40, 42, and 44. However, the substrate 61 of the second MCM 60 contains an adapter vacancy 62. The adapter vacancy 62 is designed to accommodate a first adapter 64 or a second adapter 66, as shown in FIGS. 5 and 6, respectively. The first adapter 64 is designed to accommodate an equivalent of the individual die 40, while the second adapter 66 is designed to accommodate an equivalent of the individual die 42. The adapters have the same footprints, thereby being positionable within the same type of slots, and utilize the electrical connections of the substrate 61 of the second MCM 60, while allowing for the accommodation of different types of die. The use of one type of adapter in accordance with the present invention is described in co-pending application for Flip Chip Adapter Package for Bare Die, Ser. No. 08/574,662, filed Dec. 19, 1995, which is hereby incorporated herein by reference.

Referring to FIG. 5, the adapter 64 includes a die slot 70 and electrical connectors 72. Different adapters may contain different electrical connections. In one embodiment, a single adapter is capable of accommodating two different types of die, and the orientation of the adapter onto the MCM is determined by the type of die utilized with the adapter, so as to utilize the appropriate electrical connections of the MCM. For example, an adapter accommodating one type of die is positioned on an MCM at one orientation, while another adapter accommodating a different type of die may be positioned on the MCM at an orientation rotated 90° with respect to the adapter accommodating the first type of die.

Figure 7:
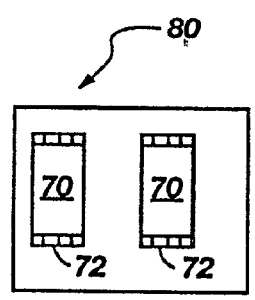
FIG. 7 is a top view of another alternative embodiment of a semiconductor die adapter illustrating the accommodation of multiple die.

In accordance with the present invention, a second MCM 60 having an unacceptable die 40 or 42 may be corrected by adding the appropriate adapter 64 or 66 to the adapter vacancy 62 of the substrate 61. In alternative embodiments, a multiple adapter 80, as shown in FIG. 7, may accommodate more than one die including different types and sizes of die.

In one embodiment, the adapter to be positioned within the adapter vacancy 62 is used as a substrate for the testing and burn-in of an individual die. Accordingly, an unacceptable individual die and its corresponding adapter are dispensed relatively inexpensively, while a KGD previously attached to an adapter is ready to be added to the adapter vacancy of an MCM.

As previously stated, one vacant position on a substrate can be positioned within the region defined by the position accommodating different die types and sizes while consuming a minimum of space on the adapter.

Characteristics of the described and illustrated embodiments are intended for illustrative purposes, and are not to be considered limiting or restrictive. It is to be understood that various adaptations and modifications may be made to the embodiments illustrated herein without departing from the spirit and scope of the invention, as defined by the following claims and equivalents thereof.

What is claimed is:

1. A multi-chip module system comprising:
a substrate having a first position having, in turn, a predetermined configuration for locating a first semiconductor device thereat and having a second position having, in turn, a predetermined configuration for locating a second semiconductor device thereat on the multi-chip module system, the second position having no semiconductor device located thereat until a semiconductor device is installed to replace a defective semiconductor device at the second position;
a first semiconductor device located in the first position of the substrate for use in the multi-chip module system, the first semiconductor device having a first predetermined the first semiconductor device having been burned in at the first position on the substrate; and a second known-good-die located at the second position, the second semiconductor device having a second predetermined performance characteristic.

2. The multi-chip module system of claim 1, further comprising:

a third position having the predetermined configuration for locating the second semiconductor device thereat which is substantially the same as the predetermined configuration of the first position.

3. The multi-chip module system of claim 1, further comprising:

the second position having the predetermined configuration for locating the second semiconductor device thereat; and the second semiconductor device having a second predetermined performance characteristic of at least substantially twice that of the first predetermined performance characteristic of the first semiconductor device.

4. A multi-chip module system comprising:

a substrate having a first position having, in turn, a predetermined configuration for locating a first semiconductor device thereat, having a second position having, in turn, a predetermined configuration for locating a second semiconductor device thereat, and having a third position having, in turn, a predetermined configuration for locating a third semiconductor device thereat on the multi-chip module system, the third position having no semiconductor device located thereat until a semiconductor device is installed to replace a defective semiconductor device at another position;

the first semiconductor device located in the first position of the substrate for use in the multi-chip module system, the first semiconductor device having a first predetermined performance characteristic; and a second known-good-die semiconductor device located in the second position of the substrate for use in the multi-chip module system, the second semiconductor device having a second predetermined performance characteristic, wherein the first and second semiconductor devices have been burned in at the first and second positions, respectively, on the substrate.

5. The multi-chip module system of claim 4, further comprising:

the third position having a predetermined configuration for locating a third semiconductor device thereat which is substantially the same as the predetermined configuration of the first position.

6. The multi-chip module system of claim 4, further comprising:

the third position having a predetermined configuration for locating a third semiconductor device thereat; and the third semiconductor device having a predetermined performance characteristic substantially similar to that of the first predetermined performance characteristic of the first semiconductor device.

7. The multi-chip module system of claim 4, wherein the first semiconductor device comprises a memory device.

8. The multi-chip module system of claim 4, wherein the second semiconductor device comprises a memory device.

9. The multi-chip module system of claim 4, wherein the first semiconductor device comprises a microprocessor device.

10. The multi-chip module system of claim 4, wherein the second semiconductor device comprises a microprocessor device.

11. The multi-chip module system of claim 4, wherein the multi-chip module system comprises a single-in-line memory module system.

12. The multi-chip module system of claim 4, further comprising:

a third semiconductor device; and an adapter connected to the third semiconductor device, the adapter having a configuration for connecting the adapter to the third position on the substrate to allow connection of the third semiconductor device to the substrate.

13. A multi-chip module system comprising:

a substrate having two opposing sides, the substrate having a first position having, in turn, a predetermined configuration for locating a first semiconductor device thereat, having a second position having, in turn, a predetermined configuration for locating a second semiconductor device thereat, having a third position having, in turn, a predetermined configuration for locating a third semiconductor device thereat, the third position having no semiconductor device located thereat until a semiconductor device is installed to replace a defective semiconductor device at another position, and having a fourth position having, in turn, a predetermined configuration for locating a fourth semiconductor device thereat on the multi-chip module system, the fourth position having no semiconductor device located thereat until a semiconductor device is installed to replace a defective semiconductor device at another position;

the first semiconductor device located in the first position of the substrate for use in the multi-chip module system, the first semiconductor device having a first predetermined performance characteristic; and a second known-good-die semiconductor device located in the second position of the substrate for use in the multi-chip module system, the second semiconductor device having a second predetermined performance characteristic, the first device being burned in at the first position on the substrate.

14. The multi-chip system module of claim 13, wherein: the third position and the fourth position are on opposing sides of the substrate.

15. A multi-chip module system comprising:

a substrate having a first predetermined configuration position for locating a first semiconductor device thereat and having a second predetermined configuration position for locating a second semiconductor device thereat on the multi-chip module system, the second position having no semiconductor device located thereat until a semiconductor device is installed to replace a defective semiconductor device at another position;

the first semiconductor device located in the first predetermined configuration position of the substrate for use in the multi-chip module system, the first semiconductor device having a first predetermined performance characteristic, the first semiconductor device being burned in at the first predetermined configuration position on the substrate; and a second known-good-die located at the second predetermined configuration position.

16. The multi-chip module system of claim 15, further comprising:

a third predetermined configuration position for locating the second semiconductor device thereat which is substantially the same as the predetermined configuration of the first position.

17. The multi-chip module system of claim 15, further comprising:
the third predetermined configuration position having a predetermined configuration for locating the second semiconductor device thereat; and
the second semiconductor device having a predetermined performance characteristic substantially similar to that of the first predetermined performance characteristic of the first semiconductor device.

18. A multi-chip module system comprising:
a substrate having a first predetermined configuration position for locating a first semiconductor device thereat, having a second predetermined configuration position for locating a second semiconductor device thereat, and having a third predetermined configuration position for locating a third semiconductor device thereat on the multi-chip module system, the third position having no semiconductor device located thereat until a semiconductor device is installed to replace a defective semiconductor device at another position;
the first semiconductor device located in the first predetermined configuration position of the substrate for use in the multi-chip module system, the first semiconductor device having a first predetermined performance characteristic; and
a known-good-die second semiconductor device located in the second predetermined configuration position of the substrate for use in the multi-chip module system, the second semiconductor device having a second predetermined performance characteristic.

19. The multi-chip module system of claim 18, further comprising:
the third predetermined configuration position for locating the third semiconductor device thereat which is substantially the same as the predetermined configuration of the first position.

20. The multi-chip module system of claim 18, further comprising:
the third predetermined configuration position for locating the third semiconductor device thereat; and
the third semiconductor device having a third predetermined performance characteristic substantially similar to that of the first predetermined performance characteristic of the first semiconductor device.

21. The multi-chip module system of claim 18, wherein the first semiconductor device comprises a memory device.

22. The multi-chip module system of claim 18, wherein the second semiconductor device comprises a memory device.

23. The multi-chip module system of claim 18, wherein the first semiconductor device comprises a microprocessor device.

24. The multi-chip module system of claim 18, wherein the second semiconductor device comprises a microprocessor device.

25. The multi-chip module system of claim 18, wherein the multi-chip module system comprises a single-in-line memory module system.

26. The multi-chip module system of claim 18, further comprising:
an adapter connected to the third semiconductor device, the adapter having a configuration for connecting the adapter to the third predetermined configuration position on the substrate to allow connection of the third semiconductor device to the substrate.

27. A multi-chip module system comprising:
a substrate having two opposing sides, the substrate having a first predetermined configuration position for locating a first semiconductor device thereat, having a second predetermined configuration position for locating a second semiconductor device thereat, having a third predetermined configuration position for locating a third semiconductor device thereat, the third predetermined configuration position having no semiconductor device located thereat until a semiconductor device is installed to replace a defective semiconductor device at another position, and having a fourth predetermined configuration for locating a fourth semiconductor device thereat on the multi-chip module system, the fourth predetermined configuration position having no semiconductor device located thereat until a semiconductor device is installed to replace a defective semiconductor device at another position;
the first semiconductor device located in the first predetermined configuration position of the substrate for use in the multi-chip module system, the first semiconductor device having a first predetermined performance characteristic; and
a known-good-die second semiconductor device located in the second predetermined configuration position of the substrate for use in the multi-chip module system, the second semiconductor device having a second predetermined performance characteristic.

28. The multi-chip system module of claim 27, wherein:
the third predetermined configuration position and the fourth predetermined configuration position are located on opposing sides of the substrate.

* * * * *

UNITED STATES PATENT AND TRADEMARK OFFICE
CERTIFICATE OF CORRECTION

PATENT NO. : 7,166,915 B2 Page 1 of 1
APPLICATION NO. : 10/032734
DATED : January 23, 2007
INVENTOR(S) : Akram et al.

It is certified that error appears in the above-identified patent and that said Letters Patent is hereby corrected as shown below:

In column 7, line 2, in Claim 1, before "the" insert -- performance characteristic, --.

Signed and Sealed this

Ninth Day of December, 2008

JON W. DUDAS
*Director of the United States Patent and Trademark Office*